United States Patent
Otterstedt et al.

(10) Patent No.: US 10,776,259 B2
(45) Date of Patent: Sep. 15, 2020

(54) METHOD, APPARATUS AND DEVICE FOR DATA PROCESSING

(71) Applicant: Infineon Technologies AG, Neubiberg (DE)

(72) Inventors: Jan Otterstedt, Unterhaching (DE); Thomas Kern, Munich (DE)

(73) Assignee: Infineon Technologies AG, Neubiberg (DE)

( * ) Notice: Subject to any disclaimer, the term of this patent is extended or adjusted under 35 U.S.C. 154(b) by 362 days.

(21) Appl. No.: 14/068,454

(22) Filed: Oct. 31, 2013

(65) Prior Publication Data
US 2015/0121016 A1    Apr. 30, 2015

(51) Int. Cl.
*G06F 12/02* (2006.01)
*G11C 16/28* (2006.01)
*G11C 29/52* (2006.01)
*G06F 11/08* (2006.01)
*G11C 29/04* (2006.01)

(52) U.S. Cl.
CPC .......... *G06F 12/0238* (2013.01); *G06F 11/08* (2013.01); *G11C 16/28* (2013.01); *G11C 29/52* (2013.01); *G06F 2212/7204* (2013.01); *G11C 2029/0411* (2013.01)

(58) Field of Classification Search
CPC ......... G06F 2212/7204; G06F 12/0238; G06F 11/1048; G06F 2201/81; G06F 11/08; G06F 11/10; G06F 1/03
See application file for complete search history.

(56) References Cited

U.S. PATENT DOCUMENTS

| | | | | |
|---|---|---|---|---|
| 3,653,028 A | * | 3/1972 | Cuccio | G06F 3/023 341/99 |
| 4,047,158 A | * | 9/1977 | Jennings | G06F 3/153 358/1.11 |
| 4,402,063 A | * | 8/1983 | Wittwer | G11C 5/025 257/E27.084 |
| 8,351,290 B1 | | 1/2013 | Huang et al. | |
| 9,087,591 B1 | | 7/2015 | Huang et al. | |
| 2003/0126513 A1 | * | 7/2003 | Wuidart | 714/42 |
| 2007/0113004 A1 | * | 5/2007 | Sugimoto | G06F 3/0608 711/112 |
| 2008/0253191 A1 | * | 10/2008 | Kang | G11C 16/20 365/185.18 |
| 2009/0254696 A1 | * | 10/2009 | Kasai et al. | 711/103 |
| 2010/0223532 A1 | * | 9/2010 | Kang et al. | 714/773 |
| 2012/0033495 A1 | * | 2/2012 | Kato | G11C 16/344 365/185.05 |
| 2012/0079350 A1 | * | 3/2012 | Krick | 714/763 |
| 2013/0073924 A1 | * | 3/2013 | D'Abreu et al. | 714/763 |

(Continued)

FOREIGN PATENT DOCUMENTS

| | | | |
|---|---|---|---|
| JP | 2012033495 A | * | 2/2012 |
| JP | 2012038383 A | * | 2/2012 |
| JP | 2012181894 A | | 9/2012 |

*Primary Examiner* — Adam M Queler
*Assistant Examiner* — Alex G Olson
(74) *Attorney, Agent, or Firm* — Eschweiler & Potashnik, LLC

(57) ABSTRACT

A method for data processing is disclosed. A blank state is determined for several data bits based on a majority decision. Each data bit is represented by a group of at least two memory cells. The at least two memory cells of this group are complementary cells of a differential read memory.

20 Claims, 12 Drawing Sheets

| cell_t | cell_c | data bit | |
|---|---|---|---|
| Icell_t >> 0 µA | I cell_c >> 0 µA | undefined | both cells erased: blank state |
| Icell_t >> 0 µA | I cell_c = ~0 µA | '0' | complementary cells |
| Icell_t = ~0 µA | I cell_c >> 0 µA | '1' | complementary cells |
| Icell_t = ~0 µA | I cell_c = ~0 µA | undefined | both cells written |

Icell >> 0 µA: erased state;
Icell = ~0 µA: written state

(56) References Cited

U.S. PATENT DOCUMENTS

| | | | | |
|---|---|---|---|---|
| 2013/0332799 A1* | 12/2013 | Cho | .................... | G06F 11/1012 |
| | | | | 714/764 |
| 2014/0115241 A1* | 4/2014 | Wei | .................... | G06F 12/0246 |
| | | | | 711/103 |

* cited by examiner

Fig.1

| cell_t | cell_c | data bit | |
|---|---|---|---|
| Icell_t >> 0 µA | Icell_c >> 0 µA | undefined | both cells erased: blank state |
| Icell_t >> 0 µA | Icell_c = ~0 µA | '0' | complementary cells |
| Icell_t = ~0 µA | Icell_c >> 0 µA | '1' | complementary cells |
| Icell_t = ~0 µA | Icell_c = ~0 µA | undefined | both cells written |

Icell >> 0 µA: erased state;
Icell = ~0 µA: written state

| m/n | data word | blank indicator | |
|---|---|---|---|
| < 50% | valid, '0's for Icell_t > Icell_c '1's for Icell_t < Icell_c | '0' | word not blank, data according to cell current differences (remaining bit errors may be corrected by an error correction code (ECC)) |
| ≥ 50% | valid, special data word, e.g., all-0 | '1' | word blank |

| Status of data 1001 | ECC clean 1002 | XOR result (number $n_{fl}$ of flipped cell pairs) 1003 | Blank indicator 1004 | Corrupted data 1005 |
|---|---|---|---|---|
| Programmed | yes | $n_{fl} < n_{th}$ (e.g. 4) | 0 | 0 |
| Erased | no | $n_{fl} > n_{th}$ (e.g. 4) | 1 | 0 |
| Erased | yes | $n_{fl} > n_{th}$ (e.g. 4) | 1 | 0 |
| Corrupted | no | $n_{fl} < n_{th}$ (e.g. 4) | 0 | 1 |

Fig.12

| m/n | data word | blank indicator | error indicator | |
|---|---|---|---|---|
| < 40% | valid, '0's for Icell_t > Icell_c '1's for Icell_t < Icell_c | '0' | '0' | valid word |
| ≥ 40% <60% | erroneous | 'X' | '1' | invalid word → error |
| ≥ 60% | valid, special data word, e.g. all-0 | '1' | '0' | word blank |

Fig.13

| ECC*) clean | m/n | data word | blank indicator | error indicator | |
|---|---|---|---|---|---|
| yes | < 50% | valid, '0's for Icell_t > Icell_c '1's for Icell_t < Icell_c | '0' | '0' | valid word |
| | ≥ 50% <80% | erroneous | 'X' | '1' | invalid word → error |
| | ≥ 80% | valid, special data word, e.g. all-0 | '1' | '0' | word blank |
| no | <30% | erroneous | 'X' | '1' | invalid word → error |
| | ≥ 30% | valid, special data word, e.g. all-0 | '1' | '0' | word blank |

*) assumption: fully erased state is not ECC clean

Fig.14

| ECC*) clean | m/n | data word | blank indicator | error indicator | |
|---|---|---|---|---|---|
| yes | < 50% | valid, '0's for Icell_t > Icell_c '1's for Icell_t < Icell_c | '0' | '0' | valid word |
| | ≥ 50% <60% | erroneous | 'X' | '1' | invalid word → error |
| | ≥ 60% | valid, special data word, e.g. all-0 | '1' | '0' | word blank |
| no | <80% | erroneous | 'X' | '1' | invalid word → error |
| | ≥ 80% | valid, special data word, e.g. all-0 | '1' | '0' | word blank |

*) assumption: fully erased state is ECC clean

METHOD, APPARATUS AND DEVICE FOR DATA PROCESSING

FIELD

Embodiments of the present invention relate to a blank detection of data bits of a non-volatile memory with differential read.

BACKGROUND

A differential read can be used to detect data bits of non-volatile memory. The introduction of a differential read in a non-volatile memory (NVM) improves reliability, e.g., even after a high number of write/erase cycles, but requires (at least) two NVM cells (also referred to as a cell pair) per data bit. However, the reading of these cells can yield unpredictable results.

SUMMARY

A first embodiment relates to a method for data processing comprising:
  determining a blank state for several data bits based on a majority decision.

A second embodiment relates to an apparatus for data processing comprising a processing unit arranged to
  determine a blank state for several data bits based on a majority decision.

A third embodiment relates to a device for data processing, in particular determining a blank state of data bits, the device comprising:
  a means for determining the blank state for several data bits based on a majority decision.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

FIG. 1 shows a table summarizing states of a cell pair of a differential read NVM;

FIG. 6 shows an example table comprising a blank indicator which indicates whether a data word read is deemed blank or not;

FIG. 10 shows an example table comprising a column depicting a number of flipped cell pairs $n_{fl}$ which is compared with a predetermined threshold $n_{th}$ in order to determine whether the data bits are blank;

FIG. 12 shows an example table that utilizes two thresholds for the ratio $m/n$ to enable a distinction between the states blank, erroneous and valid;

FIG. 13 shows a table with an example use case scenario also considering an error correction code (ECC) mechanism assuming that the fully erased state is not ECC clean;

FIG. 14 shows a table with a different example use case scenario assuming that the fully erased state is ECC clean.

DETAILED DESCRIPTION

The introduction of a differential read in a non-volatile memory (NVM) improves reliability, e.g., even after a high number of write/erase cycles, but requires (at least) two NVM cells (also referred to as a cell pair) per data bit.

Depending on the states of the two cells of a pair (i.e., a cell_t and a cell_c with t=true and c=complement) the state of a stored data bit may be determined based on an example table shown in FIG. 1.

Hence, two associated NVM cells of a memory may store complimentary information, i.e. they have opposite states. As shown in FIG. 1, only a bit that has complementary cell states can be successfully decoded, i.e. one of the two cells of a cell pair has to be in the written state and the other cell has to be in the erased state to allow for successful data decoding.

However, erasing of a page comprising several data bits, each represented by two memory cells results in a state with both cells being in the erased state, a so-called "blank state". Hence, after an erase operation, the data bit for this cell pair is not yet defined. Reading such a cell pair may result in an unpredictable result or it may even provide varying results for repeated read operations.

Therefore, in case a read operation of a software reads a blank state, the result of such read operation is unpredictable. The software can include instructions executed and/or being executed on a processor or processor based system. Hence, additional measures may be required for the to determine whether or not the pair of cells is in such blank state.

Hence, examples and/or embodiments are presented below to facilitate how detect the reading of a blank state, that maintains the advantages of differential read.

Figure 2:
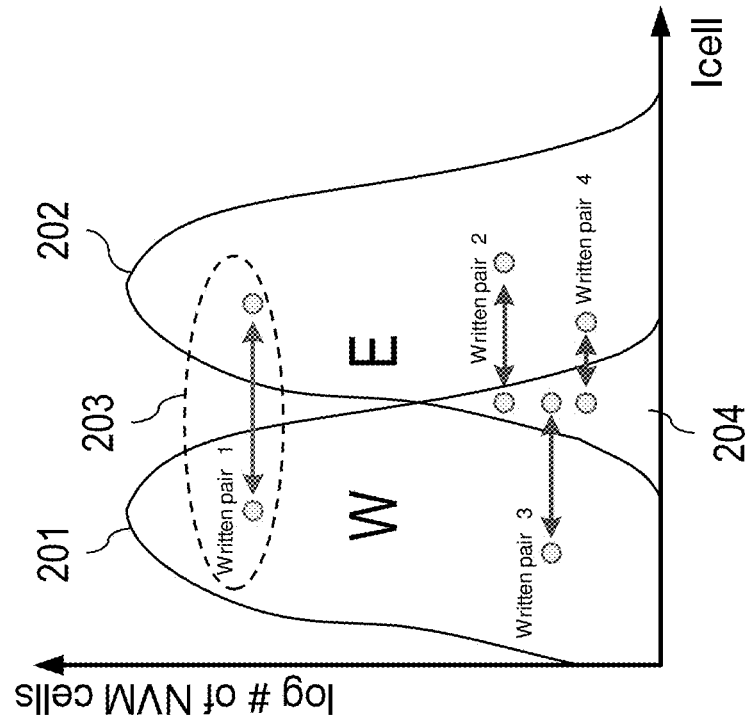
FIG. 2 shows cell current ("Icell") distributions for correctly programmed cell pairs having a written cell current distribution and an erased cell current distribution.

FIG. 2 shows cell current ("Icell") distributions for correctly programmed cell pairs comprising a written cell current distribution 201 and an erased cell current distribution 202. A written cell pair 203 ("written pair 1") comprises two cells, which supply complementary currents (one cell is the written state and the other cell is the erased state). The same applies accordingly for the remaining cell pairs depicted in FIG. 2, i.e. written pairs 2 to 4.

The erased and the written distributions 201 and 202 in FIG. 2 have an overlap area 204, wherein the cell current of one of the cells of written cell pairs 2 to 4 falls in this overlap area 204. However, for all written cell pairs 1 to 4 depicted in FIG. 2, the difference between the currents of the complementary cells allows for unambiguous decoding and thus assigning a value "0" or "1" to the data bit associated with the respective cell pair.

Figure 3:
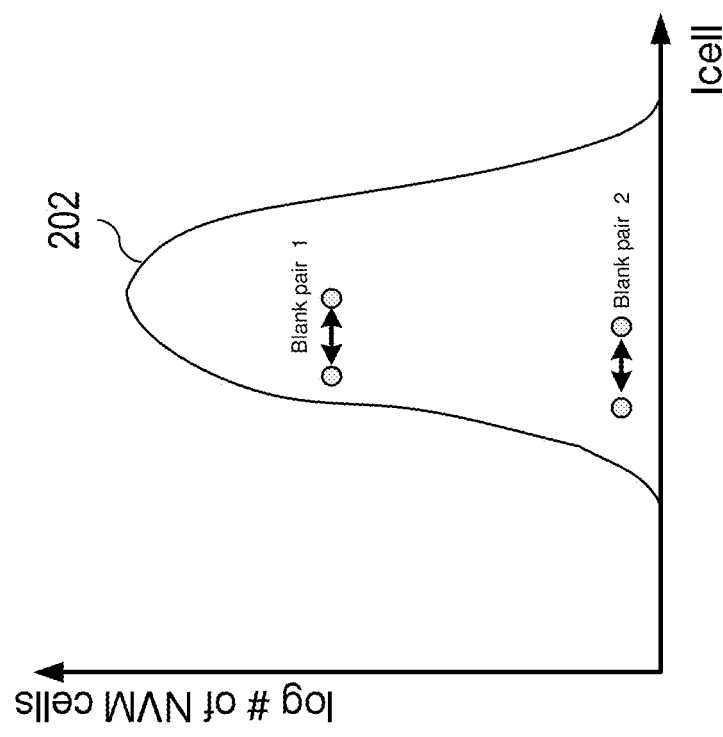
FIG. 3 shows the cell current distribution for two erased cell pairs, i.e. cell pairs that are in the blank state.

FIG. 3 shows the cell current distribution of erased cells, with two example erased cell pairs "blank pair 1" and "blank pair 2", i.e. cell pairs that are in the blank state.

Figure 4:
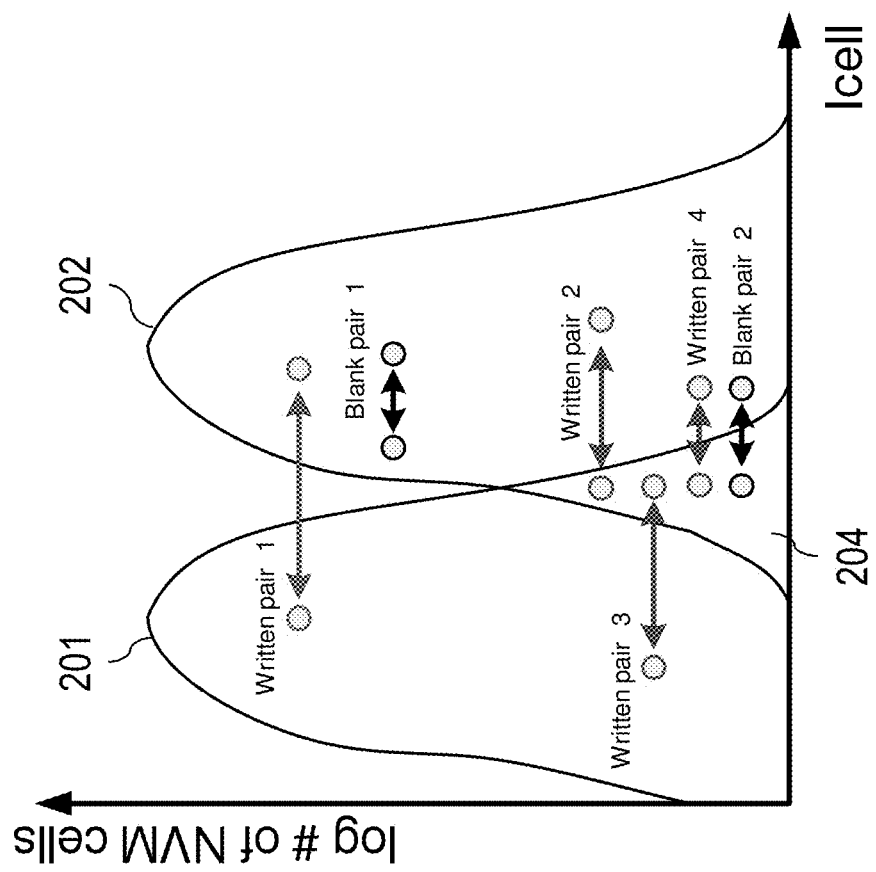
FIG. 4 shows an overlay of FIG. 2 and FIG. 3, indicating the problem of the blank state detection.

FIG. 4 shows an overlay of FIG. 2 and FIG. 3, indicating the problem of the blank state detection: Due to the overlapping distributions for written and erased cells, the state of the "written pair 4" cannot be distinguished from the state of the "blank pair 2". Hence, blank detection is not possible in such scenario based on cell currents of a single cell pair.

Example

Considering Several Data Bits

An example presented herein allows for blank detection of a state of a cell pair by considering several data bits that may form a data word, which may be written and/or read at (substantially) the same time. The number of data bits (i.e. cell pairs) considered is denoted as n.

It is noted that each cell pair may comprise several memory cells and is not limited to two complementary cells only. For example, several complementary cells can be used in such a cell pair to represent a data bit. Several data bits may form the word, wherein the word in this context is not limited to a particular number of data bits. The word may be subject to an erase procedure, i.e. all bits of the word may be erased during such erase operation. The word in this context may be regarded as page or such page may comprise several words.

This approach may utilize the fact that the probability of having a state like a written cell pair and a blank cell pair having (substantially) the same cell currents (as shown in FIG. 4 for the "written pair 4" and "blank pair 2") is relatively low, because in such case at least one of the cells of the cell pair needs to provide a current which is of the low probability overlap region 204.

Figure 5:
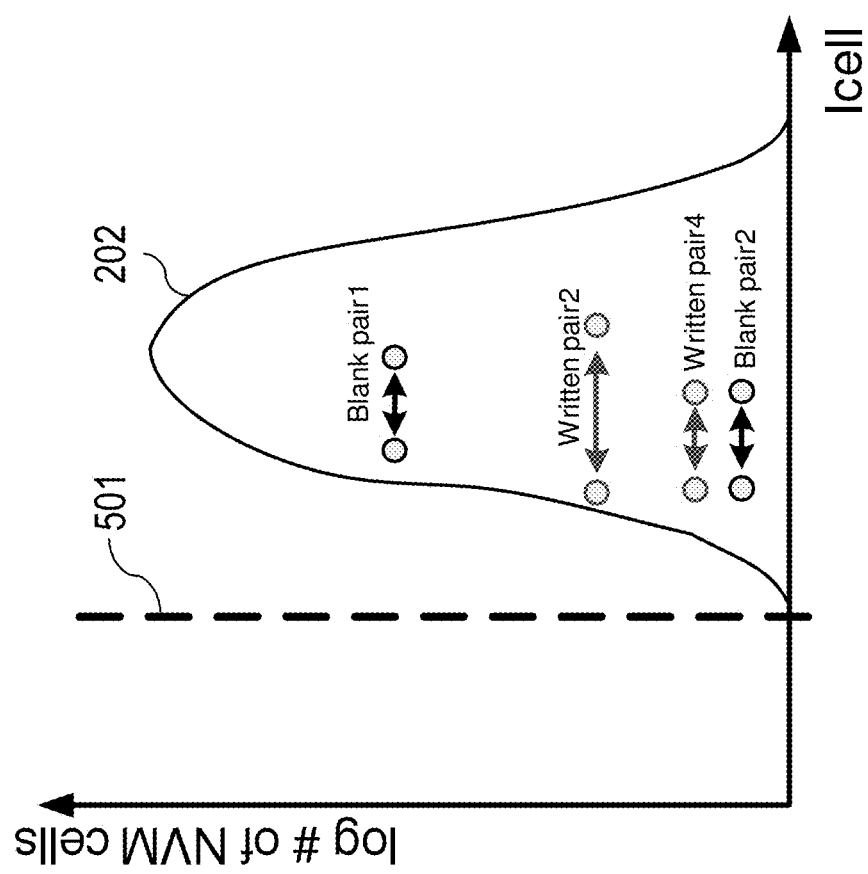
FIG. 5 shows a distribution of the cell current and written pairs and blank pairs that fall within this distribution, wherein a current threshold is provided to identify a number of potentially blank cell pairs.

FIG. 5 shows the distribution of the cell current 202 and the written pairs 2 and 4 and the blank pairs 1 and 2 that fall within this distribution 202. A current threshold 501 is provided to identify a number m of potentially blank cell pairs. The current threshold 501 can be utilized when reading the current differences of the cell pairs to decode the data bits of a word. Hence, the number of m potentially blank cell pairs is determined by all cell pairs where both cells have a cell current that is higher than the current threshold 501.

In the example shown in FIG. 5, the number m of potentially blank cell pairs amounts to four and includes the written cell pairs "written pair 2" and "written pair 4".

Next, a portion of the potentially blank cell pairs m in view of the total number of cell pairs n m/n may be compared with a predetermined threshold, e.g., 50%. Hence, the complete word (data bits) read can be defined to be blank in case m/n reaches or exceeds this predetermined threshold. This may allow for a software to automatically decide whether a bunch of data bits (data word) are in the blank state or not. The software can include instructions executed and/or being executed on a processor or processor based system.

FIG. 6 shows an example table comprising a blank indicator which indicates whether a data word read is deemed blank or not. Hence, if the ratio m/n is less than 50%, the data word is assumed to be valid, each bit of the data word is assumed to have a value of either "0" or "1" depending on the currents of their respective complementary cells. In such case, the blank indicator is set to "0". Remaining bit errors may be corrected via error correction codes (ECCs).

If the ratio m/n reaches or exceeds 50%, i.e. at least half of the cell pairs reach or exceed the current threshold 501, the data word is also assumed to be valid, but blank. Hence, the blank indicator is set to "1".

This approach allows obtaining defined data; there is no more "undefined" data. In addition, the advantages of differential reads are preserved.

Example

Differential Check

Over time and in particular with regard to cells that need to endure a high amount of read and write cycles, a read window may move towards higher cell currents. In addition, temperature may have an impact on the cell current as well.

Figure 7:
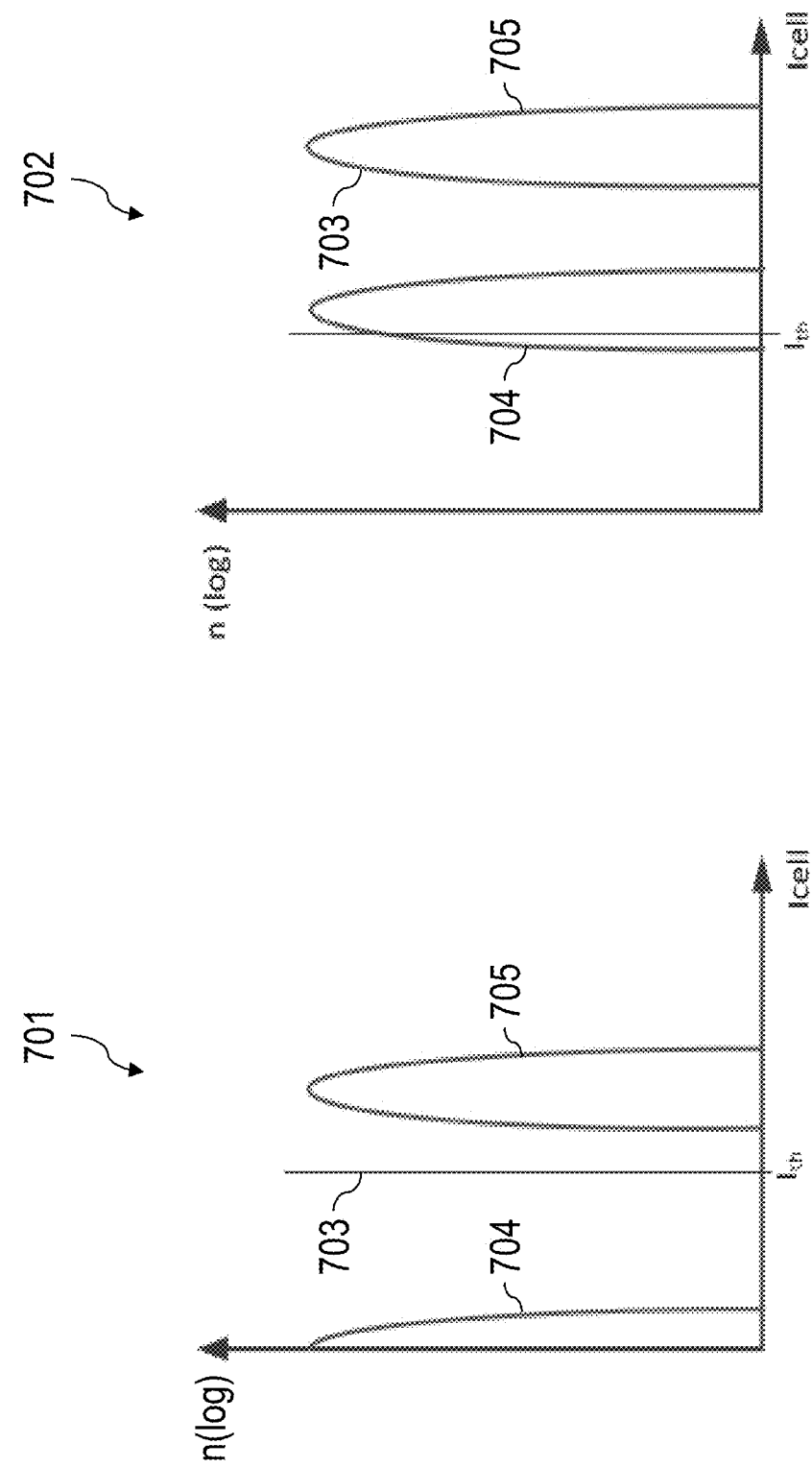
FIG. 7 shows two graphs visualizing the limits of a read window that is shifted due to a high number of read/write cycles and/or temperature effects.

In case of a moving read window, an absolute and fixed current threshold may lead to imperfect results as is shown in FIG. 7: A graph 701 shows that a current threshold 703 of a read window is between a written cell current distribution 704 and an erased cell current distribution 705. Hence, decoding of the cell pairs is feasible.

A graph 702 shows that the current threshold 703 of the read window is in the lower current range of the written cell current distribution 704, which impairs a correct detection of the cell pairs.

In order to determine whether cell pairs of a data word are in a blank state, a differential check may be conducted. Such differential check may be supported based on at least one of the following example assumptions:

In an erased state an overlap between cell and complement distributions can be assumed, because they are erased at the same time and experienced the same cycling history.

Disturbances are (statistically) equally distributed and do not create an imbalance between the cell and its complement array.

An amplifier of the complement sense does not reveal any systematic offset.

Based on these assumptions, a complement sensing on average outputs 50% zeroes and 50% ones.

If an extra current offset (by a predetermined offset amount, e.g., +1/+2/+3 sigma) is issued to either cell sense amplifier or complement cell sense amplifier input, the data with offset and without offset will change significantly.

Figure 8:
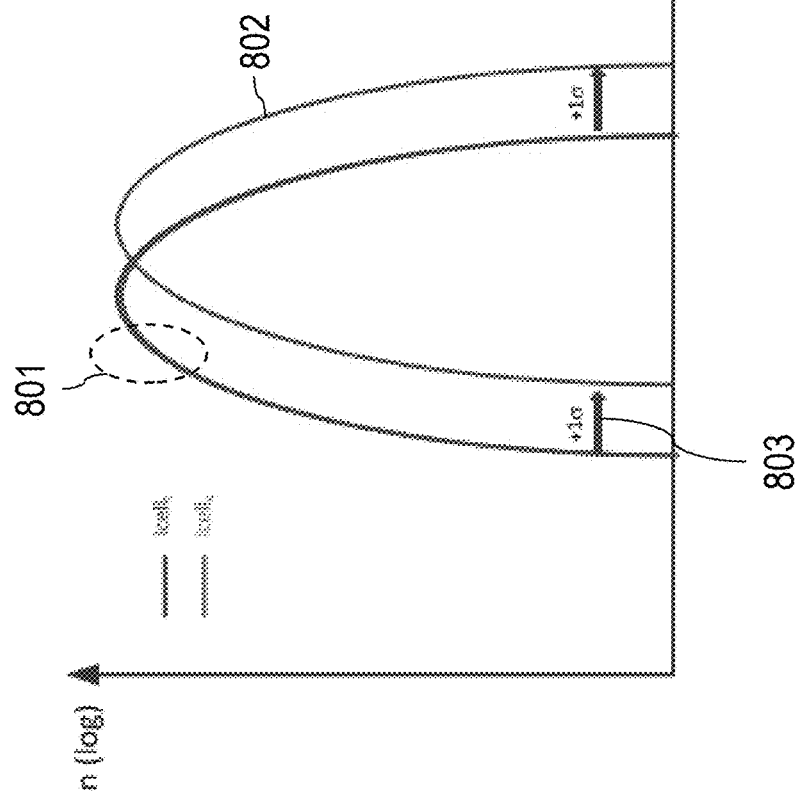
FIG. 8 shows an offset applied to a cell current of the cell thereby leading to a shifted curve.

FIG. 8 shows a positive offset of a single sigma 803 applied to the cell current of the cell "cell_c" leading to a shifted curve 802 compared to the curve 801. This shift affects all cell pairs but with different impact: Cell pairs with a cell current Icell_c being higher than the cell current Icell_t (assigned to a logical "0" according to FIG. 9) get a higher current distance (+1 sigma). In contrast, cell pairs with a cell current Icell_t being higher than the cell current Icell_c (assigned to a logical "1" according to FIG. 9) get a reduction of the current difference. If this reduction exceeds the original current difference between the cell current Icell_c and the cell current Icell_t, i.e. (Icell_c+sigma>Icell_t) the bit changes from logical "1" to "0". The number of bits changing from "1" to "0" can be modulated by this current offset. The higher the current offset the higher is the probability for flipping bits and vice versa. The positive shift can also be applied to the cell current Icell_t distribution which in turn may lead to bit flips from "0" to "1". Hence, it may then be determined how many cell pairs change their state based on the shift based on the offset applied. The change may be determined via an exclusive-or (XOR) function and it may be used to differentiate between a blank and a normally programmed, but potentially distorted distribution. The offset can be a current as shown in FIG. 8, a voltage or any other suitable parameter can be used depending on the parameter utilized in a respective sense amplifier.

Figure 9:
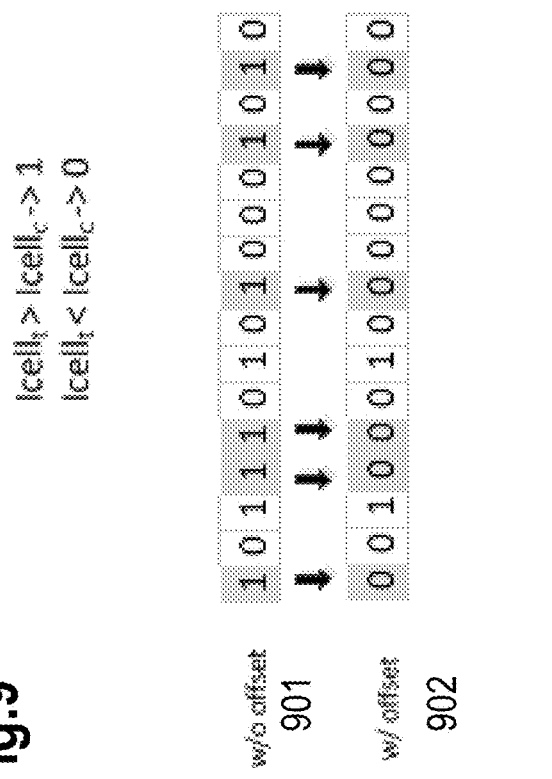
FIG. 9 shows an example of flipped cell pairs when the offset is applied.

FIG. 9 shows an example of flipped cell pairs when the offset is applied (bits representing cell pairs without offset 901 versus bits representing cell pairs after the offset was applied 902). Some bits, that without the extra current offset indicating a logical "1" (since Icell_t>Icell_c), due to the extra current added to the current Icell_c now flip and indicate a logical "0", because of the change to Icell_t<Icell_c.

Hence, according to this example, six cell pairs changed their value from "1" to "0" based on the offset being applied.

A level of change (which may be determined via an exclusive-or (XOR) function) can be used to differentiate between a blank and a normally programmed but potentially distorted distribution.

The level of change may reveal a number of flipped cell pairs. This number can be compared with a predetermined threshold and based on such comparison, a decision may be possible, whether the data word comprises blank bits or not.

In other words, adjacent cells are recognized, because they result in a flipped cell pair in case the offset is applied, which is rather normal for blank cell pairs, but rather unusual for written cell pairs. Hence, the number of flipped cell pairs based on the offset applied indicates a probability of a data word being in the written (programmed) state or in the blank state.

FIG. 10 shows an example table, wherein in column 1003 a number of flipped cell pairs $n_{fl}$ is compared with a predetermined threshold $n_{th}$. If the number of flipped cells pairs $n_{fl}$ is larger than the threshold $n_{th}$, a blank indicator (column 1004) is set to "1". Alternatively, a ratio of the flipped bits and the previous bits indicating logical "1" can be compared to a predetermined threshold.

In case the number of flipped cells $n_{fl}$ is not larger (or smaller) than the threshold $n_{th}$, the blank indicator is set to "0", the cell pairs are either programmed or corrupted, depending on an "ECC clean" status (see column 1002): The ECC clean status is fulfilled ("yes" in column 1002) if the error correction is able to reconstruct partially corrupted data or if there is no corrupted data at all. The ECC clean status is not fulfilled ("no" in column 1002) if the error correction is not capable to correct all errors. In such case, a corrupted data bit (column 1005) is set to "1" (which is otherwise set to "0").

A column 1001 thus summarized the status of the data, which is either "programmed", "erased" or "corrupted".

Additional Aspects:

As an option, a portion of cell pairs of a read word can be determined, wherein both cells of the cell pair are potentially in the written state. This can be separately indicated to software processing and/or accessing the NVM. The software can include instructions executed and/or being executed on a processor or processor based system.

Figure 11:
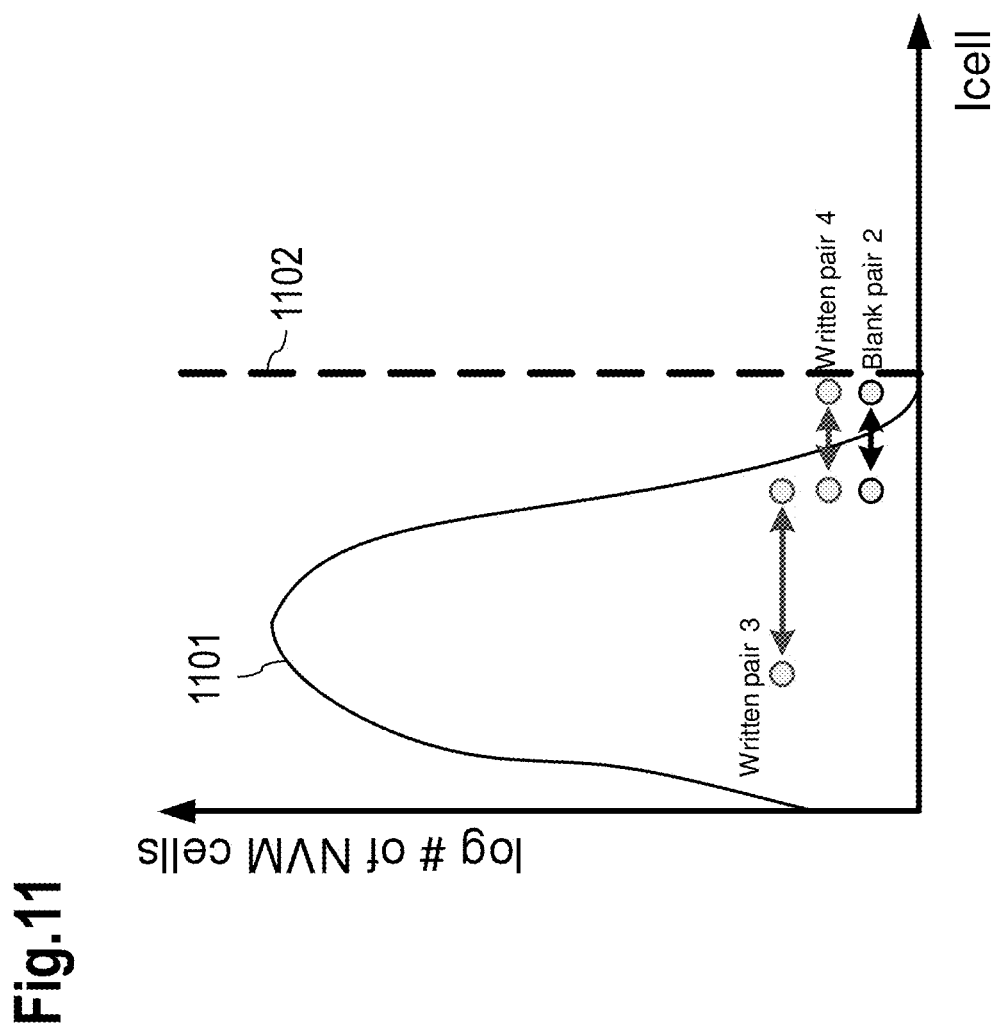
FIG. 11 shows a written cell current distribution and a current threshold to determine whether a cell pair is potentially in an undefined state.

FIG. 11 shows a written cell current distribution 1101 and a current threshold 1102. It is therefore possible to write both cells of a cell pair and generate an undefined state for this cell pair, which can be distinguished from the blank state of the cell pair. Hence, (over-)writing both cells of the cell pairs in a word can be used to invalidate data without the need to erase the whole data word.

The solution presented can be applied to NVMs with differential read, in particular to NVM cell types like Floating Gate, phase-change random access memory (PCRAM), resistive random access memory (RRAM), magneto-resistive random access memory (MRAM), metal-oxide-nitride-oxide-silicon (MONOS) devices, nanocrystal cells, etc. The solution can be used for all memory types, in particular read only memories (ROMs).

The solution can be implemented in various kinds of applications, e.g., directed to data transmission, data storage, in particular on memory devices like, e.g., hard discs.

The solution can also be combined with various types of error detection and/or error correction schemes, e.g., block codes, cyclic codes, BCH-codes, etc.

Each pair of cell may comprise several cells, in particular more than two memory cells.

FIG. 12 shows an example table that utilizes two thresholds for the ratio m/n to enable a distinction between the states blank, erroneous and valid. The values of the thresholds depicted are examples only and may vary dependent on the respective use case scenario, hardware and/or safety requirements.

In case the ratio m/n is less than 40%, the blank indicator is set to "0" and the error indicator is set to "0" thereby assuming valid data.

In case the ratio m/n is at least 40%, but less than 60%, the blank indicator may be set to "0" or "1" (indicated by "X") and the error indicator is set to "1" thereby assuming that the data word is invalid. In other words, in this case there are too many potentially blank cell pairs for the data to be valid (written or programmed) but still not enough potentially blank cell pairs to assume a blank data word.

In case the ratio m/n is at least 60%, the blank indicator is set to "1" and the error indicator is set to "0" thereby assuming a blank data word.

FIG. 13 shows a table with an example use case scenario also considering an error correction code (ECC) mechanism. Hereby, "ECC clean" means that errors can at least be corrected (or there may be no errors that need correction). Accordingly, "ECC not clean" (ECC clean—no) means that errors cannot be corrected by ECC means. The scenario according to FIG. 13 assumes that the fully erased state is not ECC clean.

In case of "ECC clean"
  a blank state of the data word is assumed in case the ratio m/n amounts to at least 80%,
  an erroneous state of the data word is assumed in case the ratio m/n is at least 50%, but less than 80%, and
  a valid data word is assumed in case the ratio m/n is less than 50%.
In case of "ECC not clean"
  a blank state of the data word is assumed in case the ratio m/n amounts to at least 30% (a low value is sufficient, because of the basic assumption that the ECC is not clean in the fully erased state of the data word), and
  an erroneous state of the data word is assumed in case the ratio m/n is less than 30%.

FIG. 14 shows a table with a different example use case scenario. The terminology of FIG. 13 applies also for FIG. 14. The scenario according to FIG. 14 assumes that the fully erased state is ECC clean.

In case of "ECC clean"
  a blank state of the data word is assumed in case the ratio m/n amounts to at least 60%,
  an erroneous state of the data word is assumed in case the ratio m/n is at least 50%, but less than 60%, and a valid data word assumed in case the ratio m/n is less than 50%.

In case of "ECC not clean"
a blank state of the data word is assumed in case the ratio m/n amounts to at least 80% (a high value is set, because of the basic assumption that the ECC is clean in the fully erased state of the data word and hence a high number of potentially blank cell pairs in view of all cell pairs of the data word is required), and
an erroneous state of the data word is assumed in case the ratio m/n is less than 80% (with the basic assumption of "ECC clean" in the fully erased state, there is a high likelihood of an error if the ratio m/n is not (very) high).

The examples suggested herein may in particular be based on at least one of the following solutions. In particular combinations of the following features could be utilized in order to reach a desired result. The features of the method could be combined with any feature(s) of the device, apparatus or system or vice versa.

A method for data processing is provided comprising determining a blank state for several data bits based on a majority decision.

The group of at least two memory cells may be implemented as a cell pair, i.e. two complementary memory cells of a differential read memory.

In an embodiment, each data bit is represented by a group of at least two memory cells, wherein the at least two memory cells of this group are complementary cells of a differential read memory.

In an embodiment, the memory cell or cells is/are of a non-volatile memory.

In an embodiment, the differential read memory includes at least one of the following:
floating gate cells;
PCRAM,
RRAM,
MRAM,
MONOS devices,
nanocrystal cells, and
ROM.

In an embodiment, the method includes one or more of:
setting a blank indicator in case the blank state for several data bits is determined;
re-setting the blank indicator in case the blank state for several data bits is not determined.

In an embodiment, the method includes determining the blank state based on a status of an error correction code.

In an embodiment, the method includes determining the blank state based on an error correction status of the fully erased data bits.

In an embodiment, the method includes:
determining a potentially blank data bit in case the current of its memory cells reaches or exceeds a predetermined current threshold;
determining a ratio of the potentially blank data bits over the total data bits;
determining a blank state for the data bits in case the ratio fulfills a predefined criterion.

In an embodiment, the method includes determining a potentially blank data bit in case the current of all of its memory cells reaches or exceeds the predetermined current threshold.

In an embodiment, the ratio fulfills the predefined criterion in case the ratio reaches or exceeds a predefined threshold.

In an embodiment, the method includes determining the potentially blank data bits during or after a read operation of the data bits.

In an embodiment, the method includes:
applying a predetermined offset to either a cell sense amplifier or to a complementary sense amplifier;
determining a number of flipped data bits;
determine a blank state for the data bits in case the number of flipped data bits fulfills a predefined criterion.

It is noted that the offset can be any (combination of) current, voltage, time information (e.g., delay) or any suitable parameter which may be utilized, e.g., by a sense amplifier.

In an embodiment, the method includes determining a blank state for the data bits in case the number and/or a ratio of flipped data bits reaches or exceeds a predefined threshold.

In an embodiment, the method includes determining a number of flipped data bits via an exclusive-or function.

In an embodiment, the method includes invalidating at least one data bit by overwriting at least one memory cell of at least one data bit.

Hence, (over-)writing the cells of the cell pairs in a word can be used to invalidate data without the need to erase the whole data word.

An apparatus for data processing is suggested, the apparatus having a processing unit arranged to
determine a blank state for several data bits based on a majority decision.

In an embodiment, each data bit is represented by a group of at least two memory cells. The at least two memory cells of this group are complementary cells of a differential read memory.

In an embodiment, the memory cell is a memory cell of a non-volatile memory.

In an embodiment, the differential read memory includes at least one of the following:
floating gate cells;
PCRAM,
RRAM,
MRAM,
MONOS devices,
nanocrystal cells, and
ROM.

In an embodiment, the processing unit is arranged to
determine a potentially blank data bit in case the current of its memory cells reaches or exceeds a predetermined current threshold;
determine a ratio of the potentially blank data bits over the total data bits; and
determine a blank state for the data bits in case the ratio fulfills a predefined criterion.

In an embodiment, the processing unit is arranged to
apply a predetermined offset to either a cell sense amplifier or to a complementary sense amplifier;
determine a number of flipped data bits; and
determine a blank state for the data bits in case the number of flipped data bits fulfills a predefined criterion.

In an embodiment, the processing unit is arranged to
invalidate at least one data bit by overwriting at least one memory cell of at least one data bit.

Also, a device for data processing, which includes determining a blank state of data bits, includes:
a means for determining the blank state for several data bits based on a majority decision.

According to an embodiment, each data bit is represented by a group of at least two memory cells. The at least two memory cells of this group are complementary cells of a differential read memory.

Although various embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in software based implementations, using the appropriate processor instructions, or in hybrid implementations that utilize a combination of hardware logic and software logic to achieve the same results. Such modifications to the inventive concept are intended to be covered by the appended claims.

The invention claimed is:

1. A method for data processing comprising:
   determining a blank state for several data bits based on a majority decision,
   wherein each data bit of the several data bits is represented by a group of at least two memory cells, wherein the at least two memory cells of this group are complementary cells of a differential read memory;
   setting a blank indicator for the several data bits in case the blank state is determined; and
   re-setting the blank indicator for the several data bits in case the blank state is not determined.

2. The method according to claim 1, wherein the memory cells are of a non-volatile memory.

3. The method according to claim 1, wherein the differential read memory comprises at least one of the following:
   floating gate cells;
   PCRAM,
   RRAM,
   MRAM,
   MONOS devices,
   nanocrystal cells, and
   ROM.

4. The method according to claim 1, further comprising:
   determining the blank state based on a status of an error correction code.

5. The method according to claim 1, further comprising:
   determining the blank state based on an error correction status of fully erased data bits.

6. The method according to claim 1, further comprising:
   determining one or more potentially blank data bits of the several data bits having a cell current that reaches or exceeds a predetermined current threshold;
   determining a ratio based on a number of the one or more potentially blank data bits over a number of the several total data bits of the memory cells;
   determining the blank state for the several data bits based on the ratio.

7. The method according to claim 6, further comprising:
   determining another potentially blank data bit in case the current of all of the memory cells reaches or exceeds the predetermined current threshold.

8. The method according to claim 6, wherein the ratio fulfills a predefined criterion in case the ratio reaches or exceeds a predefined threshold and determines the blank state as being blank.

9. The method according to claim 6, further comprising:
   determining the potentially blank data bits during or after a read operation of the data bits.

10. The method according to claim 1, further comprising:
    applying a predetermined offset to either a cell sense amplifier or to a complementary sense amplifier;
    determining a number of flipped data bits;
    determining the blank state for the data bits in case the number of flipped data bits fulfills a predefined criterion.

11. The method according to claim 10, further comprising:
    determining the blank state for the data bits in case the number and/or a ratio of flipped data bits reaches or exceeds a predefined threshold.

12. The method according to claim 10, further comprising:
    determining the number of flipped data bits via an exclusive-or function.

13. The method according to claim 1, further comprising:
    invalidating at least one data bit by overwriting at least one memory cell of at least one data bit.

14. An apparatus for data processing comprising:
    a processing unit arranged to determine a blank state for several data bits based on a majority decision, wherein each data bit of the several data bits is represented by a group of at least two memory cells, wherein the at least two memory cells of the group are complementary cells of a differential read memory;
    wherein the processing unit is further arranged to set a blank indicator for the several data bits in case the blank state is determined; and
    re-set the blank indicator for the several data bits in case the blank state is not determined.

15. The apparatus according to claim 14, wherein the memory cells are of a non-volatile memory.

16. The apparatus according to claim 14, wherein the differential read memory comprises at least one of the following:
    floating gate cells;
    PCRAM,
    RRAM,
    MRAM,
    MONOS devices,
    nanocrystal cells, and
    ROM.

17. The apparatus according to claim 14, wherein the processing unit is arranged to
    determine a potentially blank data bit in case the current of its memory cells reaches or exceeds a predetermined current threshold;
    determine a ratio of the potentially blank data bits over the total data bits; and
    determine a blank state for the data bits in case the ratio fulfills a predefined criterion.

18. The apparatus according to claim 14, wherein the processing unit is arranged to:
    apply a predetermined offset to either a cell sense amplifier or to a complementary sense amplifier;
    determine a number of flipped data bits; and
    determine a blank state for the data bits in case the number of flipped data bits fulfills a predefined criterion.

19. The apparatus according to claim 14, wherein processing unit is arranged to invalidate at least one data bit by overwriting at least one memory cell of at least one data bit.

20. A device for data processing, including determining a blank state of data bits, the device comprising:
- a processing logic for determining a blank state for several data bits based on a majority decision;
- a memory where each data bit is represented by a group of at least two memory cells, wherein the at least two memory cells of this group are complementary cells of a differential read memory;
- wherein the processing logic is arranged to set a blank indicator for the several data bits in case the blank state is determined; and
- re-set the blank indicator for the several data bits in case the blank state is not determined.

* * * * *